(12) United States Patent
Kimura et al.

(10) Patent No.: US 6,907,128 B2
(45) Date of Patent: Jun. 14, 2005

(54) NOISE CANCELING APPARATUS FOR WEIGHT MEASUREMENT, AND NOISE CANCELING METHOD FOR WEIGHT MEASUREMENT

(75) Inventors: Takashi Kimura, Shiga (JP); Masayoshi Nakajima, Shiga (JP); Shuuji Murata, Shiga (JP); Yukio Wakasa, Shiga (JP); Kazuhiro Suhara, Shiga (JP)

(73) Assignee: Ishida Co., Ltd., Kyoto (JP)

( * ) Notice: Subject to any disclaimer, the term of this patent is extended or adjusted under 35 U.S.C. 154(b) by 212 days.

(21) Appl. No.: 10/436,075

(22) Filed: May 13, 2003

(65) Prior Publication Data

US 2003/0215100 A1 Nov. 20, 2003

(30) Foreign Application Priority Data

May 17, 2002 (JP) .................................... P2002-143110

(51) Int. Cl.[7] .............................................. H03B 29/00
(52) U.S. Cl. ................... 381/71.1; 381/71.14; 381/94.1
(58) Field of Search ............................. 381/83, 93, 98, 381/103, 71.1, 71.14, 94.1; 177/25.11, 185

(56) References Cited

U.S. PATENT DOCUMENTS

| | | | |
|---|---|---|---|
| 5,051,942 A | | 9/1991 | Matsumoto et al. ... 364/724.01 |
| 5,062,492 A | | 11/1991 | Inoue ..................... 177/25.14 |
| 5,130,938 A | * | 7/1992 | Inoue .......................... 177/185 |
| 5,910,994 A | * | 6/1999 | Lane et al. .................... 381/93 |
| 5,960,091 A | * | 9/1999 | White et al. ................... 381/98 |

FOREIGN PATENT DOCUMENTS

EP 0429725 6/1991 ............ G01G/3/14

* cited by examiner

Primary Examiner—Sinh Tran
Assistant Examiner—Brian Tyrone Pendleton
(74) Attorney, Agent, or Firm—Staas & Halsey LLP

(57) ABSTRACT

A noise canceling apparatus (1) comprises an amplifier (10) for amplifying a measured signal (ms) outputted from a measuring device (3), an analog filter (11), an ADC (12), a digital filter (14), a coefficient control section (13), and a data input section (15). The digital filter (14) is a notch filter for attenuating a frequency component of a quantitative signal D(n) outputted from the ADC (12) at a plurality of notches (stop bands). A transfer function of the digital filter (14) is expressed by the product of a plurality of factors each having a root that corresponds to each one of the plurality of notches. The coefficient control section (13) changes a frequency component of a root corresponding to a notch selected from the plurality of notches, and thereafter, expands in a polynomial the transfer function of the reconstructed digital filter (14). On the basis of the polynomial thereby obtained, a new series of filter coefficients is calculated. A filter characteristic is controlled in such a manner that it conforms to a frequency variation of a fixed-period vibration noise, whereby the fixed-period vibration noise that varies in frequency is attenuated with a high degree of precision.

16 Claims, 8 Drawing Sheets

F I G . 3
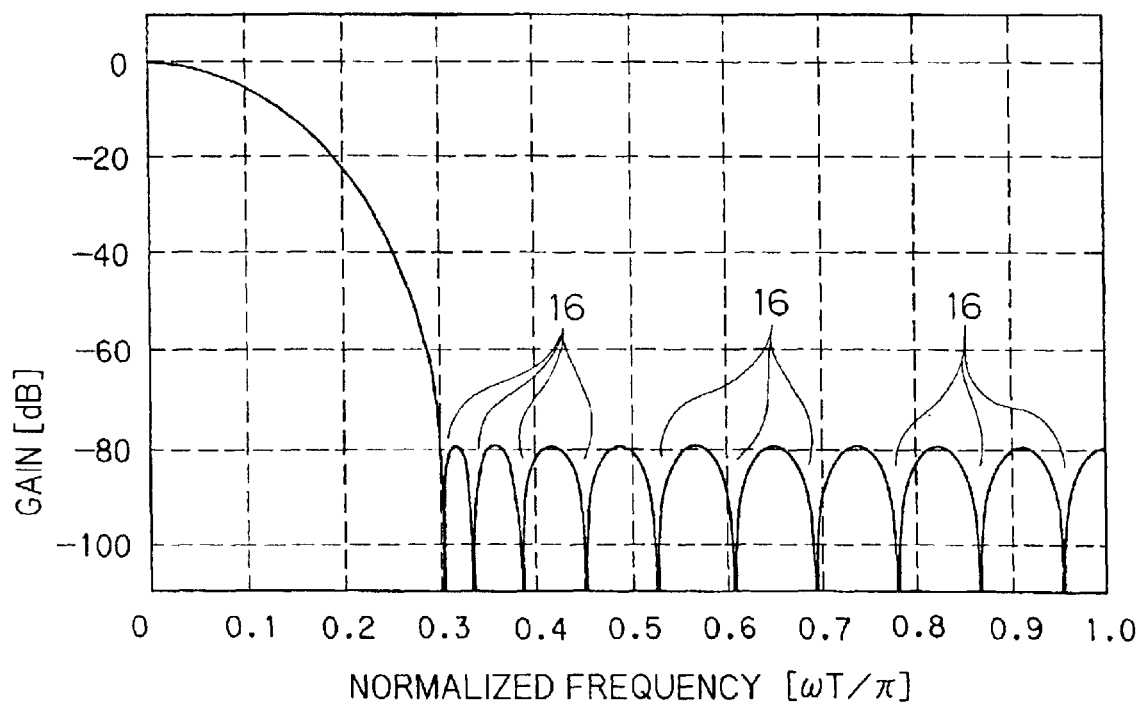

F I G. 5
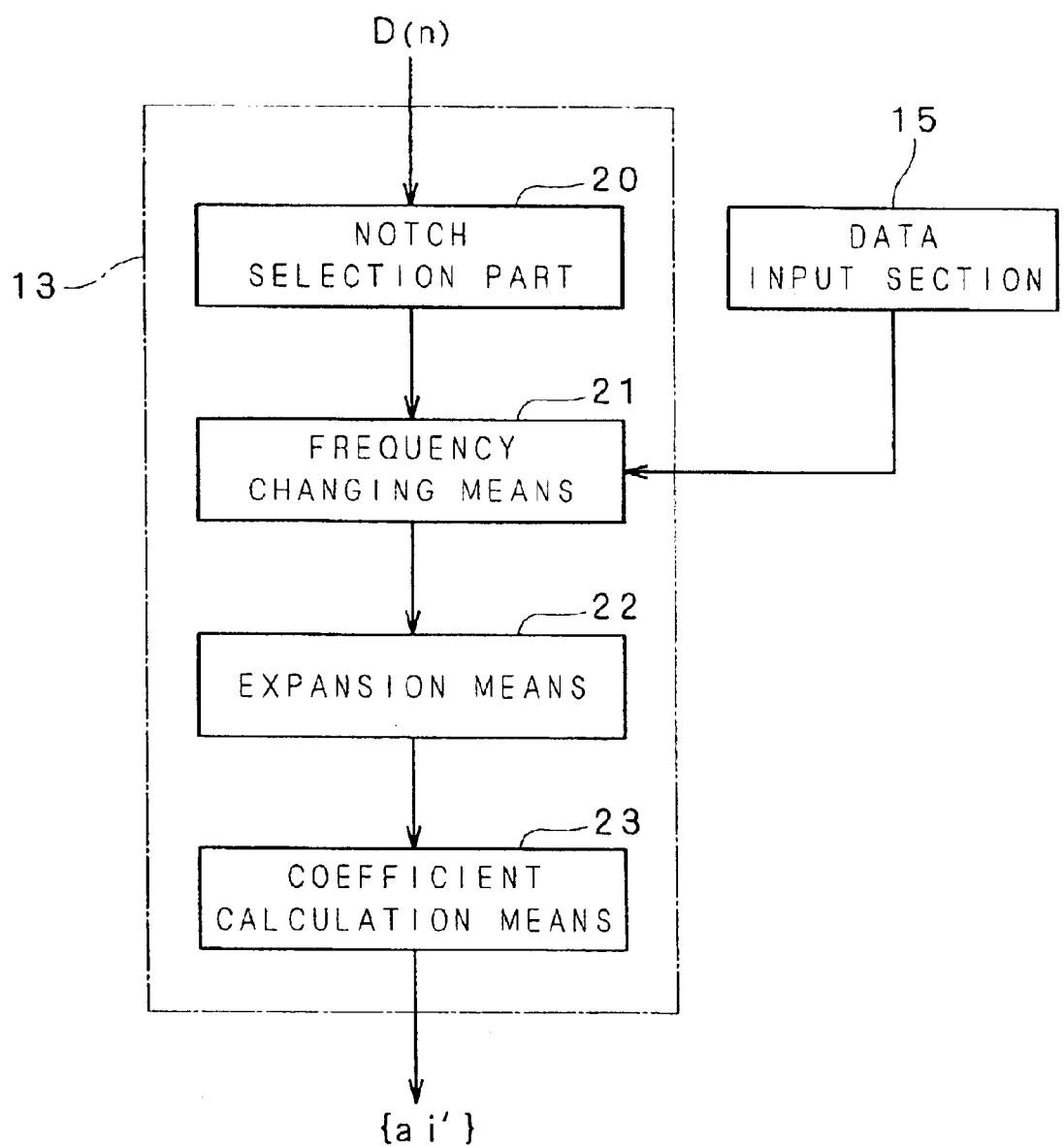

F I G. 6
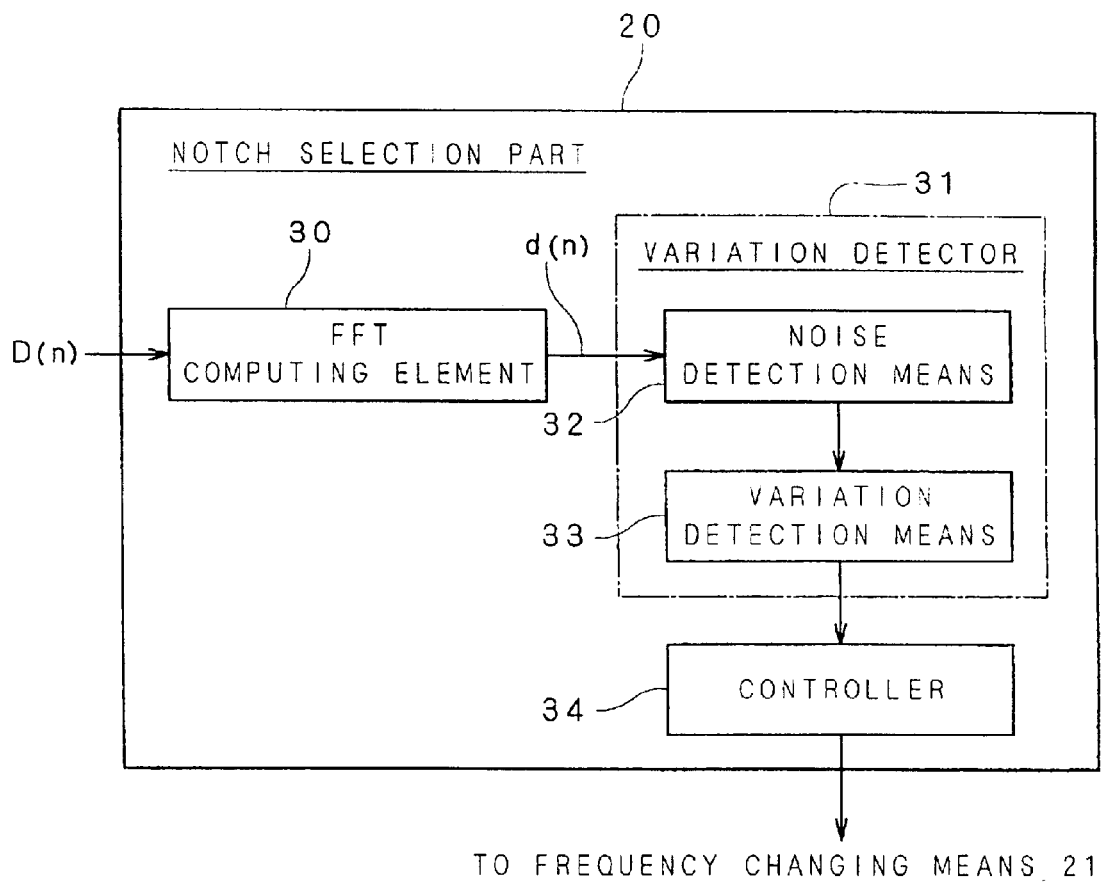

NOISE CANCELING APPARATUS FOR WEIGHT MEASUREMENT, AND NOISE CANCELING METHOD FOR WEIGHT MEASUREMENT

BACKGROUND OF THE INVENTION

1. Field of the Invention

The present invention relates to a noise canceling apparatus for weight measurement, and to a noise canceling method for weight measurement using a digital filter.

2. Description of the Background Art

A measured signal, outputted from a load detector such as a strain gauge load cell or a force balance, contains various types of noises resulting from a measuring system. In the case of load measurement in a carrier system, noise resulting from rotation vibration by a motor for driving a belt conveyer or by a carrier roller, or electrical noise resulting from a commercial power source, may be caused. These noises are generally superposed on the measured signal as vibration noises of a fixed period. A measuring system including a structure has a frequency specific to this structure. When external vibration falling within the range containing this specific frequency acts on the measuring system, the external vibration is amplified at about the specific frequency, and thereafter, emerges into the measured signal as a vibration noise. The vibration noise of a fixed period and the vibration noise resulting from the specific frequency will be collectively referred to as a "fixed-period vibration noise".

For cancellation of the fixed-period vibration noise, digital filters have been used in recent years that are unlikely to be subject to secular changes and ambient surroundings, bearing relatively easy-to-change filter characteristics. Among those digital filters, a finite impulse response (FIR) digital filter, exhibiting excellence especially in stability, has been preferred.

For cancellation of the fixed-period vibration noise in the measured signal, a low-pass filter has conventionally been used that provides a sufficient attenuation in a frequency band corresponding to the fixed-period vibration noises. Using such low-pass filter, the fixed-period vibration noise can be attenuated in a relatively short period. The exemplary technique of which is introduced in Japanese Patent Publication No. 63-052684 (1988), titled "Method of Canceling Fixed-Period Vibration Wave". In this method, a moving average filter is used which provides the number of times of sampling as the number of its taps, for a period corresponding approximately to an integer multiple of the period of the fixed-period vibration noise. However, this number of taps may vary according to a period (frequency) of a noise, possibly causing delay time in the moving average filter. Further disadvantageously, when the number of times of sampling, for a period corresponding to an integer multiple of the period of the fixed-period vibration noise, does not coincide with the number of taps, error resulting from such discordance may be likely.

In order to handle various fixed-period vibration noises having their respective frequencies including power supply noise of a relatively high frequency and mechanical vibration noise of a relatively low frequency, for example, the method disclosed in the foregoing publication is required to prepare a multistage moving average filter to be responsive to each type of noise. When various noise vibrations are to be attenuated by a single-stage filter, this filter is required to contain a plurality of stop bands (notches) to be respectively responsive to these noise vibrations.

In a carrier and measuring system, an object to be measured may be carried at a variable speed, causing a motor or a roller constituting the system to vibrate at a frequency that suitably varies according to the speed. In this case, a multistage filter should be prepared to respond to a frequency variation of a fixed-period vibration noise. Further, various types of filter characteristics have been required to respectively respond to the noise having a varying frequency such as the one resulting from a motor or a roller, and the noise having a virtually constant frequency such as the one resulting from a power supply frequency.

SUMMARY OF THE INVENTION

The present invention is directed to a noise canceling apparatus for weight measurement, and to a noise canceling method for weight measurement using a digital filter.

According to the present invention, the noise canceling apparatus for weight measurement eliminates a fixed-period vibration noise contained in a quantitative signal as a result of digitization of a signal obtained by detecting a weight of an object to be measured. The noise canceling apparatus comprises: a band pass filter for filtering a frequency component of the quantitative signal at a plurality of notches, the filtering using variable filter coefficients; and a coefficient control section for calculating a series of the filter coefficients, sand supplying the series to the band pass filter. The band pass filter has a frequency characteristic including the plurality of notches, and a transfer function of the band pass filter includes a product of a plurality of factors each having a root corresponding to each one of the plurality of notches. The coefficient control section comprises: a frequency changing element for changing a frequency component of a root as a part of a factor, the root corresponding to a notch selected from the plurality of notches; an expansion element for expanding a product of a plurality of factors in a polynomial, the product constituting the transfer function of the band pas filter; and a coefficient calculating element for calculating a series of the filter coefficients on the basis of the polynomial.

The present invention is also directed to a noise canceling method for weight measurement, in which a filter characteristic is controlled in such a manner that it conforms to a frequency variation of a fixed-period vibration noise, whereby the fixed-period vibration noise that varies in frequency is attenuated with a high degree of precision.

Only a root corresponding to the notch that is selected from the plurality of notches of the band pass filter undergoes change in value to conform to the fixed-period vibration noise varying in frequency, whereby the selected notch is allowed to follow the variation of the fixed-period vibration noise. The fixed-period vibration noise can precisely be eliminated without delay. Further, only one series of filter coefficients is required to obtain a new series to be responsive to the variation of the fixed-period vibration noise, whereby a memory capacity for storing filter coefficients is controlled to a small amount. As a result, the noise canceling apparatus is allowed to effectively eliminate the fixed-period vibration noise.

Preferably, the band pass filter is a finite impulse response (FIR) digital filter.

The present invention is also directed to a noise canceling method for weight measurement, in which a filter characteristic is controlled in such a manner that it conforms to a frequency variation of a fixed-period vibration noise, whereby the fixed-period vibration noise that varies in frequency is attenuated with a high degree of precision.

Using the FIR digital filter, a noise canceling apparatus for weight measurement exhibiting excellence in operation stability can be provided.

Still preferably, the noise canceling apparatus for weight measurement further comprises a data input section for manually inputting the amount of variation of a frequency component to be changed at the frequency changing element.

The present invention is also directed to a noise canceling method for weight measurement, in which a filter characteristic is controlled in such a manner that it conforms to a frequency variation of a fixed-period vibration noise, whereby the fixed-period vibration noise that varies in frequency is attenuated with a high degree of precision.

The user is allowed to manually change the notch frequency through the data input section to conform to the variation of the fixed-period vibration noise. For precisely and easily making fine adjustment of the filter coefficients, it is only required for the user to designate a notch and the amount of variation of a frequency component.

Further preferably, the noise canceling apparatus further comprises: a Fourier transform element for calculating a frequency characteristic of the quantitative signal; a variation detector for analyzing the frequency characteristic, to detect the amount of variation in a frequency band of a fixed-period vibration noise contained in the quantitative signal; and a controller for designating the amount of variation of the frequency component to be changed at the frequency changing element, on the basis of the amount of variation detected at the variation detector.

The present invention is also directed to a noise canceling method for weight measurement, in which a filter characteristic is controlled in such a manner that it conforms to a frequency variation of a fixed-period vibration noise, whereby the fixed-period vibration noise that varies in frequency is attenuated with a high degree of precision.

While monitoring a frequency vibration in a frequency band of the fixed-period vibration noise, the filter coefficients are changed to conform to this frequency variation. As a result, the notch is allowed to automatically follow the noise variation. The notch is also operative to promptly follow a fast-moving small variation of a fixed-period vibration noise with a high degree of precision.

It is therefore an object of the present invention to provide a noise canceling apparatus for weight measurement and a noise canceling method for weight measurement, in which a filter characteristic is controlled in such a manner that it conforms to a frequency variation of a fixed-period vibration noise, whereby the fixed-period vibration noise that varies in frequency is attenuated with a high degree of precision.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a graph showing an amplitude characteristic of a digital filter;

FIG. 5 is a functional block diagram schematically illustrating a configuration of a coefficient control section of the noise canceling apparatus according to the preferred embodiment of the present invention;

FIG. 6 is a functional block diagram schematically illustrating a configuration of a notch selection part of the noise canceling apparatus according to the preferred embodiment of the present invention;

DESCRIPTION OF THE PREFERRED EMBODIMENTS

Figure 1:
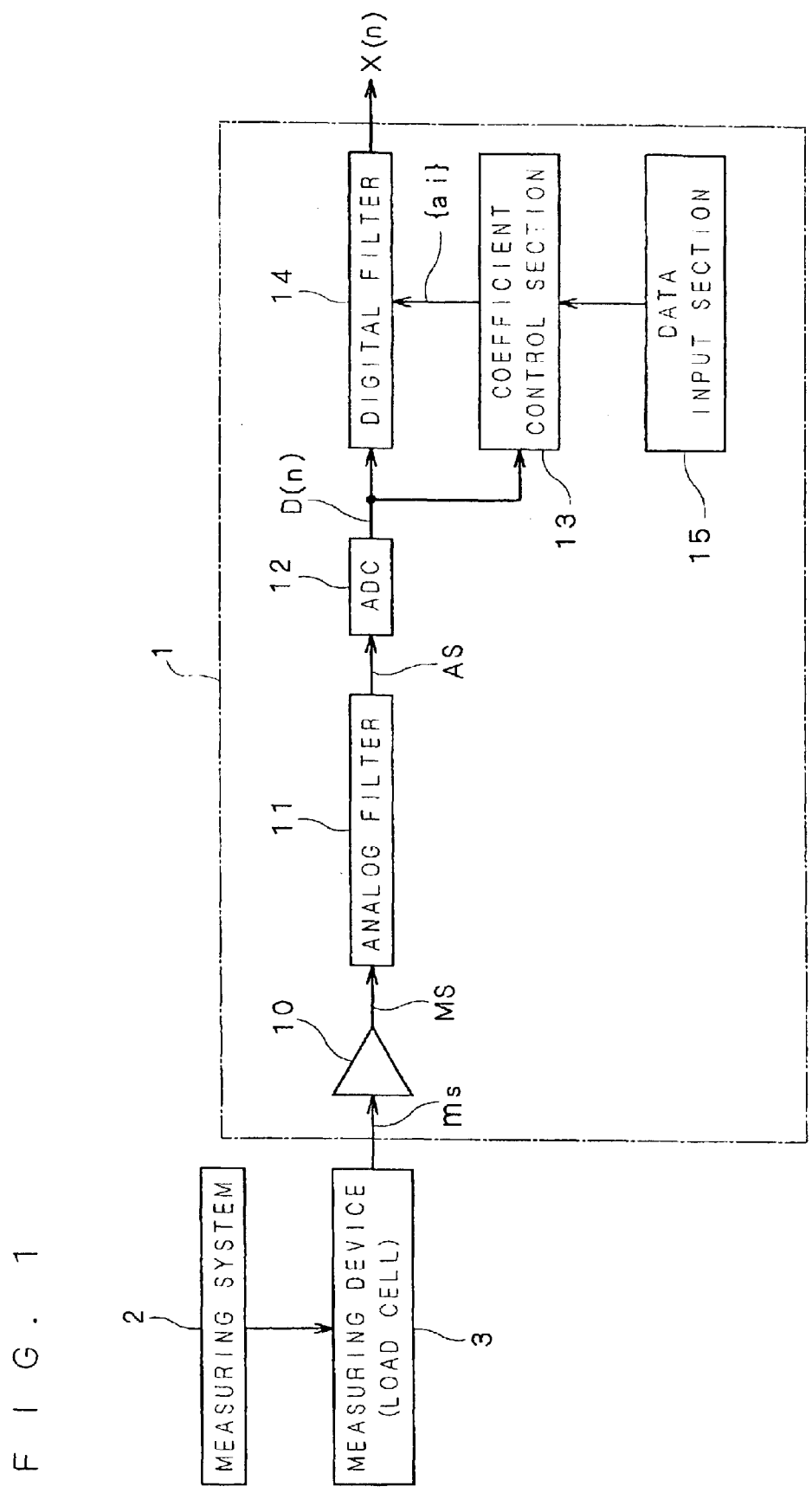
FIG. 1 is a functional block diagram illustrating a noise canceling apparatus for weight measurement according to a preferred embodiment of the present invention.

FIG. 1 is a functional block diagram illustrating a noise canceling apparatus 1 for weight measurement according to the preferred embodiment of the present invention.

The noise canceling apparatus 1 comprises an amplifier 10 for amplifying a measured signal ms outputted from a measuring device 3, an analog filter 11, an A/D converter (ADC) 12, a digital filter 14, a coefficient control section 13, and a data input section 15. The measuring device (load cell) 3 measures a weight received from a measuring system 2, and outputs the resultant measured signal ms to the noise canceling apparatus 1.

The amplifier 10 amplifies the measured signal ms received from the measuring device 3, and outputs a resultant amplified signal MS to the analog filter 11. The analog filter 11 eliminates an unnecessary high-band component from the amplified signal MS, and outputs a resultant analog signal As. The A/D converter 12 samples the analog signal As received from the analog filter 11 with a predetermined sampling period, and quantizes the signal As by a predetermined bit number. A resultant digital signal (hereinafter referred to as a quantitative signal) D(n) (where n is an integer) thereby obtained is outputted from the A/D converter 12 both to the digital filter 14 and to the coefficient control section 13.

Figure 2:
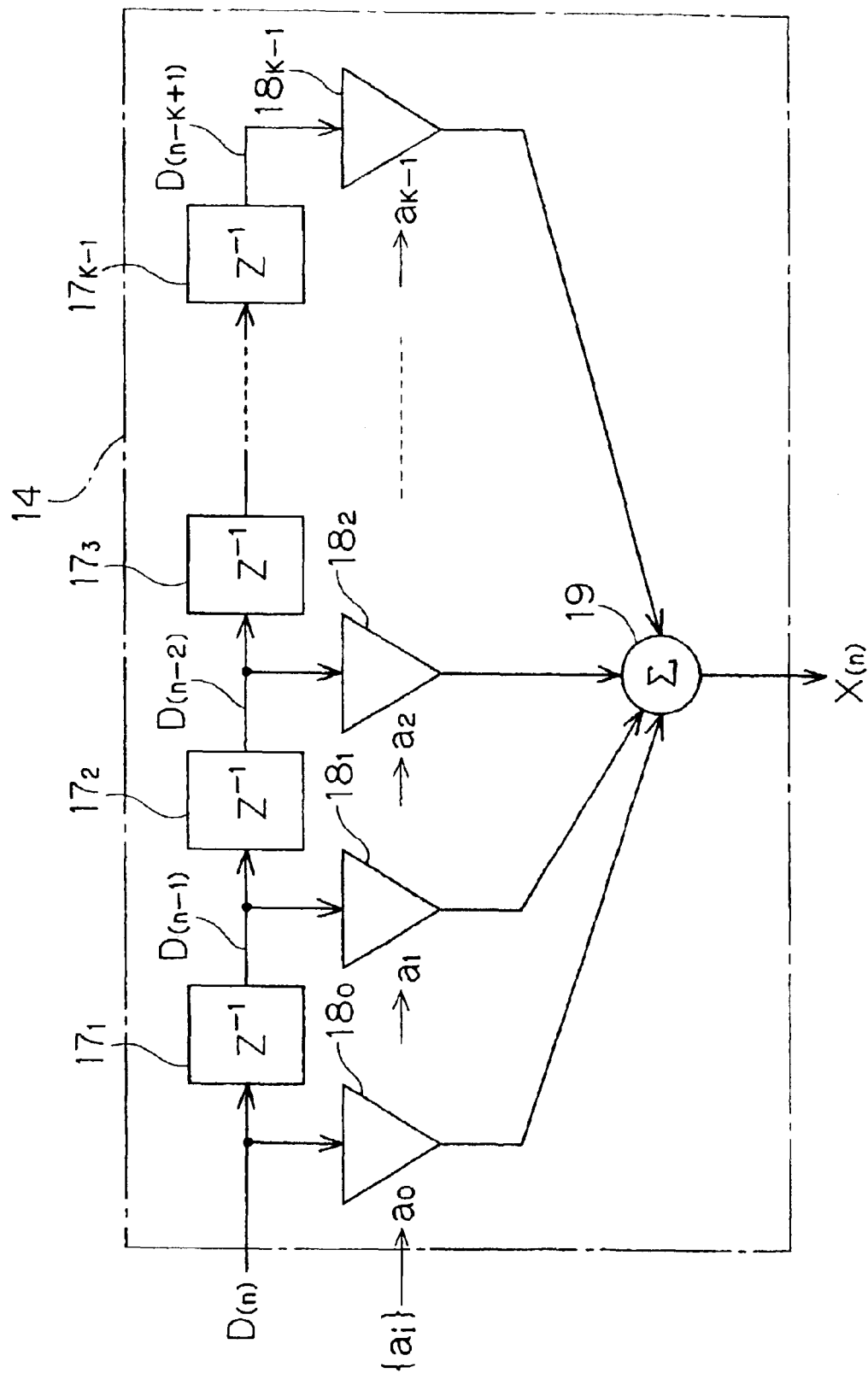
FIG. 2 illustrates a schematic configuration of an FIR digital filter.

FIG. 2 schematically illustrates a configuration of the finite impulse response (FIR) digital filter 14 for filtering the quantitative signal D(n).

The digital filter 14 has a filtering function using a series of filter coefficients $\{a_i\}$ (where i is 0, 1, 2, ..., K−1) supplied from the coefficient control section 13. The digital filter 14 is a K-tap band pass filter (low-pass filter), where K is an integer of 2 or more. The digital filter 14 comprises delay elements $17_1, 17_2, 17_3, \ldots, 17_{K-1}$ for respectively delaying a series of quantitative signals D(n) inputted thereto by one period, coefficient multipliers $18_0, 18_1, \ldots, 18_{K-1}$, and an adder 19. The (K−1)-numbered delay elements including $17_1$ through $17_{K-1}$ each include a D flip-flop, for example, and are connected in series in (K−1)-numbered stages. Each time a pulse (not shown) is supplied with a sampling period T, the delay elements $17_1$ through $17_{K-1}$ capture and hold quantitative signals D(s) (where s ranges between n and (n−K+1)) inputted thereto from their respective previous stages, and output the same. Using the filter coefficients $a_0$ through $a_{K-1}$ inputted from the coefficient control section 13, the coefficient multipliers $18_0$ through $18_{K-1}$ respectively perform coefficient multiplication. The coefficient multiplier $18_m$ (where m ranges between 0 and K−1) multiplies an input signal D(n−m) by the filter coefficient $a_m$, and outputs the product to the adder 19. The adder 19 adds all the signals transmitted thereto from the coefficient multipliers $18_0$ through $18_{K-1}$, and outputs a resultant sum of products X(n).

A transfer function H(z) obtained by z-transform is expressed by the following equation (1):

$$H(z) = \sum_{m=0}^{K-1} a_m z^{-m} \qquad (1)$$
$$= a_0 + a_1 z^{-1} + a_2 z^{-2} + \ldots + a_{K-1} z^{-(K-1)}$$

The digital filter 14 is operative to function as a notch filter bearing a frequency characteristic including a plurality of notches (stop bands). It is generally desirable that an amplitude characteristic at a pass band is substantially constant, that the notches thereof have the same ripple characteristic. The known technique of designing a digital filter having the same ripple characteristic is Remez algorithm. FIG. 3 is a graph showing an amplitude characteristic of the digital filter 14 designed by Remez algorithm. In this graph, the vertical axis shows an attenuation (gain) of a signal, and the horizontal axis shows a normalized frequency ($\omega T/\pi$). The amplitude characteristic of the digital filter 14 is calculated according to an absolute value $|H(e^{j\omega T})|$ of a transfer function $H(e^{j\omega T})$, which is expressed by the following equation (2):

$$H(e^{j\omega T}) = \sum_{m=0}^{K-1} a_m (e^{-j\omega T})^m \qquad (2)$$

where $j^2 = -1$, $\omega$ is an angular frequency, and T is a sampling period.

As shown in FIG. 3, the amplitude characteristic of the digital filter 14 contains notches 16 where the signal shows a large amount of attenuation. The transfer function H(z) of the digital filter 14 includes zero-point complex roots $\lambda_1$, $\lambda_2, \ldots, \lambda_M$ (where M is a radical number) corresponding to a part of, or all of the notches 16, as seen from the following equation (3). In the present invention, the "zero point" means, not a reference point in the measuring process, but a point in a z-plane where the transfer function H(z) takes a zero value.

$$H(z) = (z^{-1} - \lambda_1)(z^{-1} - \lambda_2)(z^{-1} - \lambda_3) \ldots (z^{-1} - \lambda_M) \qquad (3)$$

Figure 4:
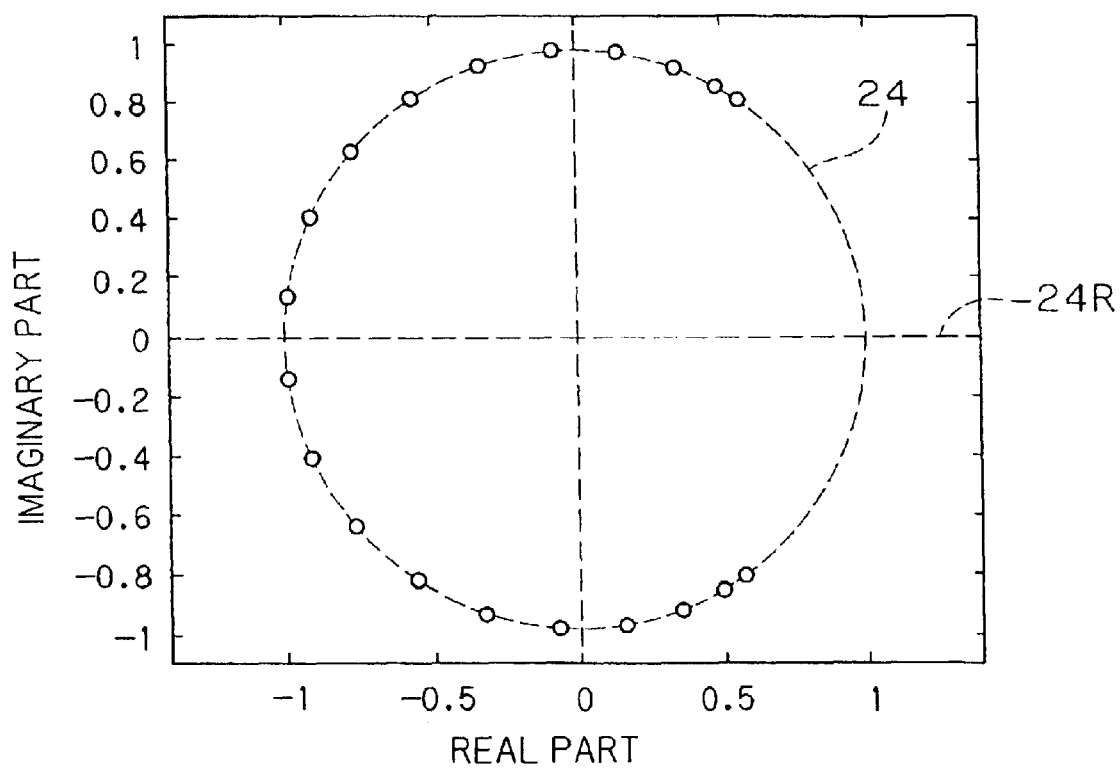
FIG. 4 is a graph showing an arrangement of complex roots that constitute a transfer function H(z) of a digital filter.

The transfer function H(z) is the product of factors $(z^{-1} - \lambda_1)$ $(z^{-1} - \lambda_2)$, ... $(z^{-1} - \lambda_M)$, respectively including the complex roots $\lambda_1, \lambda_2, \ldots, \lambda_M$. FIG. 4 is a graph showing an arrangement of the complex roots of the transfer function H(z) expressed by the equation (3). The horizontal axis of the graph shows a real part of a complex number z, and the vertical axis thereof shows an imaginary part of the complex number z. All the complex roots including $\lambda_1, \lambda_2, \ldots, \lambda_M$ are arranged on a unit circle 24.

In this preferred embodiment, the transfer function H(z) is shown to include only the product of a plurality of factors $(z^{-1} - \lambda_1)$ $(z^{-1} - \lambda_2)$, ... $(z^{-1} - \lambda_M)$. However, the present invention is not limited to this. As long as this product is included, the transfer function H(z) may be expressed by an alternative way. As an example, the transfer function H(z) may include a fractional form, with a denominator containing a pole.

When the complex root $\lambda_k$ (where k is 1, 2, ..., M) is expressed in polar coordinates, the following equation (4) is obtained:

$$\lambda_k = r_k \exp(j\theta_k) \qquad (4)$$

where $r_k = \sqrt{(Re(\lambda_k))^2 + (Im(\lambda_k))^2}$, and $\theta_k = \tan^{-1}(Im(\lambda_k)/Re(\lambda_k))$ In the equation (4), $r_k$ is an amplitude (absolute value) of the complex root $\lambda_k$, $Re(\lambda_k)$ is a real part of the complex root $\lambda_k$, and $Im(\lambda_k)$ is an imaginary part of the complex root $\lambda_k$. Further, $\theta_k$ is an angle about an origin in the graph of FIG. 4, which is corresponding to the product of a frequency component $\omega$ and the sampling period T in this preferred embodiment. The digital filter 14 has zero points in the section where the normalized frequency ($\omega T/\pi$) ranges between $-1$ and $+1$, which is obtained by normalization of the product of $\omega$ and T by $\pi$ ranging between $-1$ and $+1$. However, these zero points are located in an axial symmetrical manner with respect to a real axis 24R, which is as shown in FIG. 4. In view of this, the amplitude characteristic shown in the graph of FIG. 3 is limited to the section where the normalized frequency ranges between 0 and $+1$.

In order to change the frequency of the notch 16 (hereinafter referred to as a notch frequency) in the conventional technique, the number of taps of a digital filter has been changed, or the sampling period T has been changed. However, such conventional technique has found difficulty in practically responding to a fixed-period vibration noise that varies in frequency. Further, it is impractical to continuously change the sampling period T to conform to a variation of a fixed-period vibration noise. Even if the sampling period T can be changed in a continuous manner, such change causes variation in a notch frequency which is corresponding to a noise having no variation in frequency such as the one resulting from a commercial power source. According to the present invention, arbitrary one is selected from the plurality of notches 16, and only the selected notch 16 undergoes change in frequency, as to be described below.

FIG. 5 is a functional block diagram schematically illustrating a configuration of the coefficient control section 13 shown in FIG. 1. The coefficient control section 13 comprises a notch selection part 20, frequency changing means 21, expansion means 22, and coefficient calculation means 23. The frequency changing means 21 receives a designated notch 16 and the amount of variation $\delta\omega$ corresponding to the designated notch 16 from the notch selection part 20 or from the data input section 15. The frequency changing means 21 changes the frequency component $\omega_k$ of the complex root $\lambda_k$ corresponding to the notch 16 selected from the plurality of notches 16 to $(\omega_k + \delta\omega)$. Using the renewed frequency component $(\omega_k + \delta\omega)$, the frequency changing means 21 also generates a new complex root $\lambda_k'$, and outputs the same to the expansion means 22. The renewed complex root $\lambda_k'$ is expressed by the following equation (5):

$$\lambda_k' = r_k \exp(j\theta_k + j\Delta\theta) \qquad (5)$$

where $\theta = \omega_k T$, and $\Delta\theta = \delta\omega T$

The expansion means 22 thereafter expands in a polynomial the transfer function H(z) of the digital filter 14 as reconstructed using the renewed complex root $\lambda_k'$. The reconstructed transfer function H(z) is expressed by the following equation (6A), which is followed by a nominal (6B) as a result of expansion thereof.

$$H(z) = (z^{-1} - \lambda_1')(z^{-1} - \lambda_k') \ldots (z^{-1} - \lambda_M') \qquad (6A)$$

$$H(z) = a_0' + a_1' z^{-1} + a_2' z^{-2} + \ldots + a_{K-1}' z^{-(K-1)} \qquad (6B)$$

On the basis of the polynomial equation (6B), the coefficient calculation means 23 then obtains a new series of filter coefficients $\{a_i'\}$, and outputs the same. That is, the new series of filter coefficients $\{a_i'\}$ is generated from the previous series $\{a_i\}$, and is thereafter outputted to the digital filter 14. In the digital filter 14, the coefficient multipliers 18$_0$ through 18$_{K-1}$ respectively hold the renewed coefficients $a_0'$ through $a_{K-1}'$ transmitted from the coefficient control section 13, multiply the input signals D(n) through D(n−K+1) by the coefficients $a_0'$ through $a_{K-1}'$, respectively, and output the products to the adder 19. The adder 19 adds all the signals outputted from the coefficient multipliers $18_0$ through $18_{K-1}$ together, and outputs the quantitative signal X(n) containing no fixed-period vibration noise as discussed.

As described, according to the noise canceling apparatus 1, in response to the fixed-period vibration noise that varies in frequency, an arbitrary one is selected from the plurality of notches 16 of the digital filter 14. The value of the complex root corresponding to the arbitrary notch 16 as designated is changed, whereby the designated notch is allowed to be changed in frequency according to the variation of the fixed-period vibration noise. The change in the sampling period T or in the number of taps, as required in the conventional technique, is unnecessary, thereby providing a quick response of the digital filter 14. As a result, the noise canceling apparatus 1 is allowed to effectively eliminate various types of fixed-period vibration noises without delay. Further, the present invention requires only one series of filter coefficients $\{a_i\}$ to obtain the renewed series $\{a_i'\}$, thereby advantageously controlling a memory capacity to a small amount.

The noise canceling apparatus 1 further comprises the data input section (user interface) 15 for manually inputting the amount of variation δω of the frequency component ω to be changed at the frequency changing means 21. The notch 16 and the amount of variation δω of the frequency thereof to be changed are designated by data input by a user, and are then supplied from the data input section 15 to the frequency changing means 21. Accordingly, the user is allowed to manually change the notch frequency to conform to a variation of a fixed-period vibration noise through the data input section 15. For precisely and easily making fine adjustment of the filter coefficients $a_0$ through $a_{K-1}$, it is only required for the user to designate the notch 16 and the amount of variation δω.

When the notch 16 varying in frequency and the amount of variation δω of the frequency thereof are predictable, advance registration of the contents including the notch 16 and the amount of variation δω is desirable, according to the state of the measuring system 2. The data input section 15 thereby holds the contents of the registration and displays the same in a list, allowing the user to review the contents displayed in a list, and to manually select the notch 16 and the amount of variation δω from the displayed contents.

The noise canceling apparatus 1 is operative to automatically vary the plurality of notches 16, so that the notches 16 are allowed to follow a variation in a frequency band of a fixed-period vibration noise that is contained in the quantitative signal D(n), which is realized by the notch selection part 20 shown in FIG. 5. FIG. 6 is a functional block diagram schematically illustrating a configuration of the notch selection part 20. The notch selection part 20 comprises an FFT (fast Fourier transform) computing element 30 for performing FFT, a variation detector 31, and a controller 34. The FFT computing element 30 performs FFT on the quantitative signal D(n) inputted thereto from the A/D converter 12, calculates a frequency characteristic d(n) of the quantitative signal D(n), and outputs the same to the variation detector 31.

The variation detector 31 includes noise detection means 32 for detecting a fixed-period vibration noise contained in the quantitative signal D(n), and variation detection means 33 for detecting the amount of variation in a frequency band of one fixed-period vibration noise, or of a plurality of fixed-period vibration noises.

Figure 7:
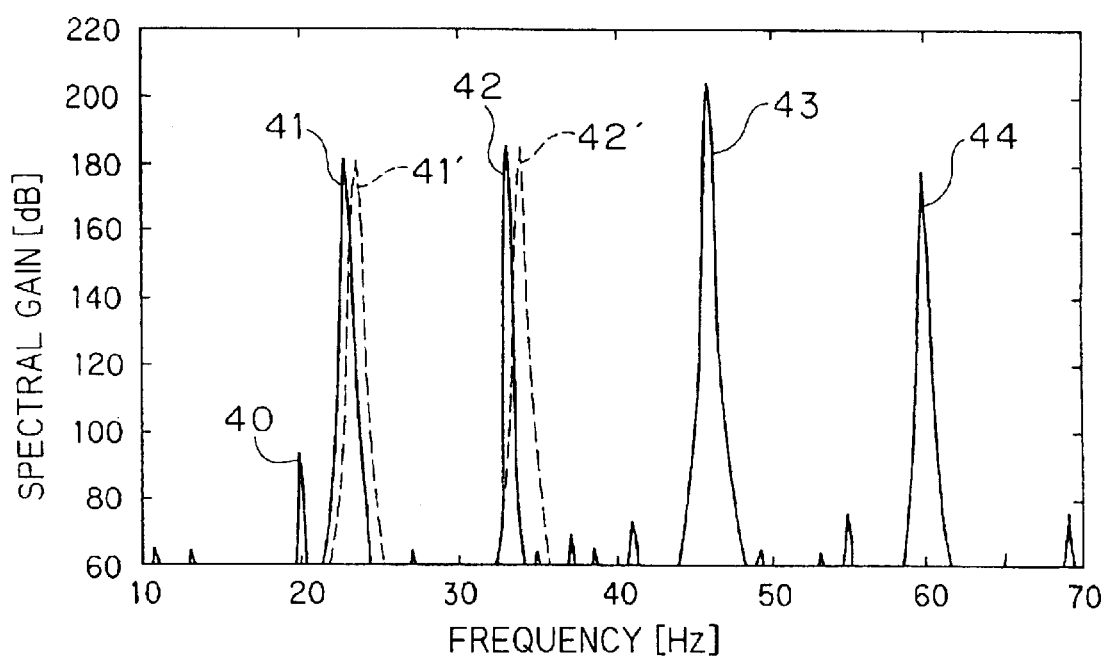
FIG. 7 is a graph showing exemplary frequency spectra of a quantitative signal.
Figure 8:
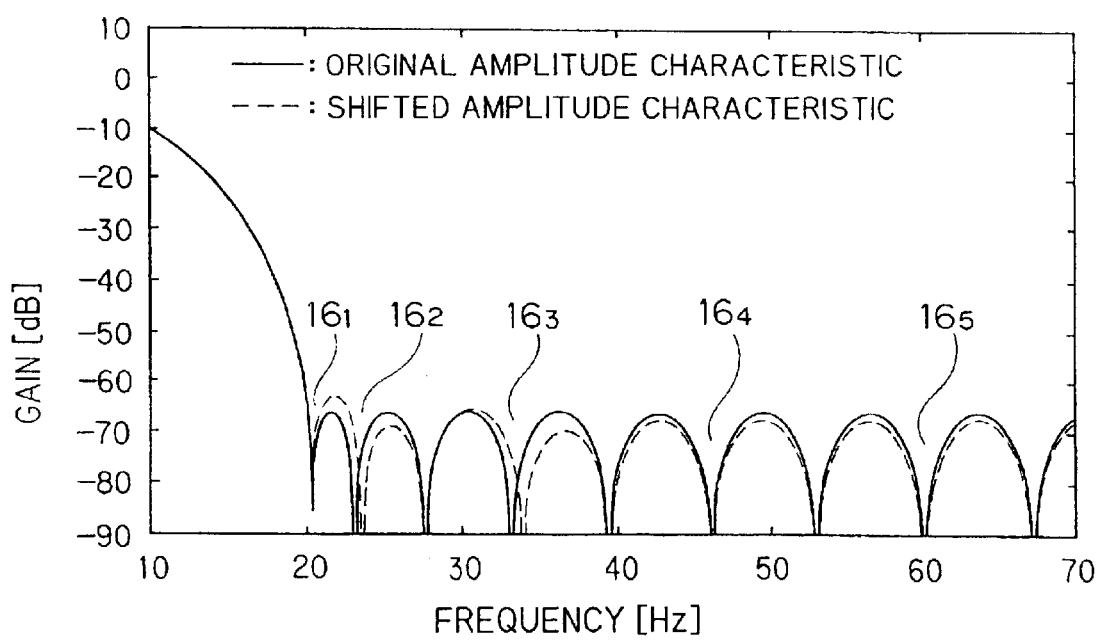
FIG. 8 is a graph showing an amplitude characteristic of a digital filter.

The noise detection means 32 analyzes the frequency characteristic d(n) inputted thereto from the FFT computing element 30, to detect a fixed-period vibration noise contained in the quantitative signal D(n). The information thereby detected such as a center frequency of the fixed-period vibration noise is then supplied to the variation detection means 33. FIG. 7 is a graph showing exemplary spectra of the frequency characteristic d(n). Spectra of noise components 40, 41, 42, 43 and 44 shown in solid lines show frequency components of different types of fixed-period vibration noises. The amplitude characteristic of the digital filter 14 for eliminating these fixed-period vibration noises is as shown in the graph of FIG. 8. The noise components 40, 41, 42, 43 and 44 in FIG. 7 are attenuated at notches (stop bands) $16_1$, $16_2$, $16_3$, $16_4$ and $16_5$ in FIG. 8, respectively. The transfer function H(z) of the digital filter 14 includes zero points (complex roots) respectively corresponding to the notches $16_1$, through $16_5$.

On the basis of the detected information inputted from the noise detection means 32, the variation detection means 33 detects the amount of variation of each fixed-period vibration noise in the spectrum, and outputs the detected amount of variation to the controller 34. Such amount of variation includes a center frequency at the peak of each noise component, for example. On the basis of this amount of variation, the controller 34 determines the amount of variation δω of the frequency component $ω_k$, which is then supplied to the frequency changing means 21 to be changed. As a result, the plurality of notches 16 are allowed to vary according to the variations of the noise components.

The spectra shown in FIG. 7 result from a carrier and measuring system. In FIG. 7, spectra shown in dashed lines are those obtained by increasing the speed of transport of the carrier and measuring system. This increase in speed causes the noise components 41 and 42 to shift to higher frequencies, which are represented as noise components 41' and 42', respectively. No shift of the other noise components 40, 43 and 44 occurs. In the noise canceling apparatus 1 of this preferred embodiment, the notches $16_2$ and $16_3$ also shift to higher frequencies to conform to the variations of the noise components 41 and 42. The amplitude characteristic thereof is as shown in dashed lines in FIG. 8. As seen from FIG. 8, in the noise canceling apparatus 1, the notches $16_2$ and $16_3$ are selected from the plurality of notches $16_1$ through $16_5$, and the selected notches $16_2$ and $16_3$ can be shifted in frequency by the respective amounts indicated in FIG. 8.

As described, in the noise canceling apparatus 1 of this preferred embodiment, while monitoring frequency variations of various types of fixed-period vibration noises contained in the quantitative signal D(n), the filter coefficients $a_0$ through $a_{K-1}$ are changed to conform to each frequency variation. As a result, the plurality of notches 16 of the digital filter 14 are automatically changed to follow the frequency variation. The plurality of notches 16 are also operative to promptly follow a fast-moving small variation of a fixed-period vibration noise with a high degree of precision.

While the invention has been shown and described in detail, the foregoing description is in all aspects illustrative and not restrictive. It is therefore understood that numerous modifications and variations can be devised without departing from the scope of the invention.

What is claimed is:

1. A noise canceling apparatus for weight measurement for eliminating a fixed-period vibration noise contained in a quantitative signal, said quantitative signal being a result of digitization of a signal obtained by detecting a weight of an object to be measured, said apparatus comprising:

a band pass filter for filtering a frequency component of said quantitative signal at a plurality of notches, said filtering using variable filter coefficients; and a coefficient control section for calculating a series of said filter coefficients, and supplying said series to said band pass filter, wherein said band pass filter has a frequency characteristic including said plurality of notches, and a transfer function of said band pass filter includes a product of a plurality of factors each having a root corresponding to each one of said plurality of notches, said coefficient control section comprising:

a frequency changing element for changing a frequency component of a root as a part of a factor, said root corresponding to a notch selected from said plurality of notches;

an expansion element for expanding a product of a plurality of factors in a polynomial, said product constituting said transfer function of said band pass filter; and a coefficient calculating element for calculating a series of said filter coefficients on the basis of said polynomial.

2. The noise canceling apparatus according to claim 1, wherein said band pass filter is a finite impulse response (FIR) digital filter.

3. The noise canceling apparatus according to claim 2, further comprising:

a data input section for manually inputting the amount of variation of a frequency component to be changed at said frequency changing element.

4. The noise canceling apparatus according to claim 3, comprising:

a Fourier transform element for calculating a frequency characteristic of said quantitative signal;

a variation detector for analyzing said frequency characteristic, to detect the amount of variation in a frequency band of a fixed-period vibration noise contained in said quantitative signal; and a controller for designating the amount of variation of said frequency component to be changed at said frequency changing element, on the basis of said amount of variation detected at said variation detector.

5. The noise canceling apparatus according to claim 2, comprising:

a Fourier transform element for calculating a frequency characteristic of said quantitative signal;

a variation detector for analyzing said frequency characteristic, to detect the amount of variation in a frequency band of a fixed-period vibration noise contained in said quantitative signal; and a controller for designating the amount of variation of said frequency component to be changed at said frequency changing element, on the basis of said amount of variation detected at said variation detector.

6. The noise canceling apparatus according to claim 1, further comprising:

a data input section for manually inputting the amount of variation of a frequency component to be changed at said frequency changing element.

7. The noise canceling apparatus according to claim 6, comprising:

a Fourier transform element for calculating a frequency characteristic of said quantitative signal;

a variation detector for analyzing said frequency characteristic, to detect the amount of variation in a frequency band of a fixed-period vibration noise contained in said quantitative signal; and a controller for designating the amount of variation of said frequency component to be changed at said frequency changing element, on the basis of said amount of variation detected at said variation detector.

8. The noise canceling apparatus according to claim 1, comprising:

a Fourier transform element for calculating a frequency characteristic of said quantitative signal;

a variation detector for analyzing said frequency characteristic, to detect the amount of variation in a frequency band of a fixed-period vibration noise contained in said quantitative signal; and a controller for designating the amount of variation of said frequency component to be changed at said frequency changing element, on the basis of said amount of variation detected at said variation detector.

9. A noise canceling method for weight measurement for eliminating a fixed-period vibration noise contained in a quantitative signal, said quantitative signal being a result of digitization of a signal obtained by detecting a weight of an object to be measured, said method comprising the steps of:

(a) calculating a series of filter coefficients for a band pass filter; and (b) causing a band pass filter to filter a frequency component of said quantitative signal at a plurality of notches, said band pass filter having a series of said filter coefficients, wherein said band pass filter has a frequency characteristic including said plurality of notches, and a transfer function of said band pass filter includes a product of a plurality of factors each having a root corresponding to each one of said plurality of notches, said step (a) comprising the steps of:

(a-1) changing a frequency component of a root as a part of a factor, said root corresponding to a notch selected from said plurality of notches;

(a-2) expanding a product of a plurality of factors in a polynomial, said product constituting said transfer function of said band pass filter; and (a-3) calculating a series of said filter coefficients on the basis of said polynomial.

10. The method according to claim 9, wherein said band pass filter is a finite impulse response (FIR) digital filter.

11. The method according to claim 10, further comprising the step of:

(c) manually inputting the amount of variation of a frequency component to be changed in said step (a-1).

12. The method according to claim 11, further comprising the steps of:

(e) performing Fourier transform to calculate a frequency characteristic of said quantitative signal;

(f) analyzing said frequency characteristic to detect the amount of variation in a frequency band of a fixed-period vibration noise contained in said quantitative signal; and (g) designating the amount of variation of said frequency component to be changed in said step (a-1), on the basis of said amount of variation detected in said step (f).

13. The method according to claim 10, further comprising the steps of:

(e) performing Fourier transform to calculate a frequency characteristic of said quantitative signal;

(f) analyzing said frequency characteristic to detect the amount of variation in a frequency band of a fixed-period vibration noise contained in said quantitative signal; and (g) designating the amount of variation of said frequency component to be changed in said step (a-1), on the basis of said amount of variation detected in said step (f).

14. The method according to claim 9, further comprising the step of:

(c) manually inputting the amount of variation of a frequency component to be changed in said step (a-1).

15. The method according to claim 14, further comprising the steps of:

(e) performing Fourier transform to calculate a frequency characteristic of said quantitative signal;

(f) analyzing said frequency characteristic to detect the amount of variation in a frequency band of a fixed-period vibration noise contained in said quantitative signal; and (g) designating the amount of variation of said frequency component to be changed in said step (a-1), on the basis of said amount of variation detected in said step (f).

16. The method according to claim 9, further comprising the steps of:

(e) performing Fourier transform to calculate a frequency characteristic of said quantitative signal;

(f) analyzing said frequency characteristic to detect the amount of variation in a frequency band of a fixed-period vibration noise contained in said quantitative signal; and (g) designating the amount of variation of said frequency component to be changed in said step (a-1), on the basis of said amount of variation detected in said step (f).

* * * * *